(12) United States Patent
Shah (10) Patent No.: US 7,420,154 B2
(45) Date of Patent: Sep. 2, 2008

(54) PIXEL CIRCUIT WITH NON-DESTRUCTIVE READOUT CIRCUIT AND METHODS OF OPERATION THEREOF

(75) Inventor: Joey Shah, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 11/476,019

(22) Filed: Jun. 28, 2006

(65) Prior Publication Data
US 2006/0243891 A1 Nov. 2, 2006

Related U.S. Application Data

(62) Division of application No. 10/805,412, filed on Mar. 22, 2004, now Pat. No. 7,332,703.

(51) Int. Cl.
H01L 31/00 (2006.01)

(52) U.S. Cl. ............. 250/214.1; 250/208.1; 250/214 R; 348/294; 348/297; 348/308

(58) Field of Classification Search ............. 250/214 R, 250/208.1, 214.1; 257/290–292, 440; 348/297–314, 348/294
See application file for complete search history.

(56) References Cited

U.S. PATENT DOCUMENTS

| 4,734,776 | A | | 3/1988 | Wang et al. |
| 5,751,005 | A | | 5/1998 | Wyles et al. |
| 6,140,630 | A | * | 10/2000 | Rhodes ..................... 250/208.1 |
| 6,166,768 | A | * | 12/2000 | Fossum et al. .............. 348/308 |
| 6,175,383 | B1 | * | 1/2001 | Yadid-Pecht et al. ........ 348/302 |
| 6,563,540 | B2 | * | 5/2003 | Trevino et al. .............. 348/302 |
| 2005/0001143 | A1 | | 1/2005 | Rhodes |

OTHER PUBLICATIONS

U.S. Appl. No. 10/689,635, filed Oct. 2003, Rhodes.

* cited by examiner

Primary Examiner—Georgia Y. Epps
Assistant Examiner—Francis M Legasse, Jr.
(74) Attorney, Agent, or Firm—Dickstein Shapiro LLP (57) ABSTRACT

A pixel cell allows both correlated double sampling (CDS) and automatic light control (ALC) operations through a non-destructive, parallel readout. An image sensor may include an array of pixel cells, some or all of which include a photosensor with two readout circuits attached; peripheral circuitry can sample charges generated from the photosensor through one readout circuit, then perform array readout through the other. One readout circuit connected to the photosensor provides a non-destructive readout of the generated charge. The other readout circuit can, for example, be a multiple-transistor circuit that transfers charge from the photosensor to a floating diffusion node for readout. The image sensor's readout circuitry may thus monitor the light reaching the photosensor of the cell to determine when to read out signals from the entire array.

19 Claims, 7 Drawing Sheets

PIXEL CIRCUIT WITH NON-DESTRUCTIVE READOUT CIRCUIT AND METHODS OF OPERATION THEREOF

CROSS-REFERENCE TO RELATED APPLICATION

This application is a divisional of U.S. patent application Ser. No. 10/805,412 filed on Mar. 22, 2004, now U.S. Pat. No. 7,332,703 the subject matter of which is incorporated in its entirety by reference herein.

FIELD OF THE INVENTION

The present invention relates to the field of imaging devices, particularly to improved pixel cells capable of supporting automatic light control operations.

BACKGROUND

Typically, a digital imager array includes a focal plane array of pixel cells, each one of the cells including a photo-conversion device such as, e.g., a photogate, photoconductor, or a photodiode. In a complementary metal oxide semiconductor (CMOS) imager, each pixel cell also has a readout circuit that typically includes a source follower output transistor. The photo-conversion device converts photons to electrons which are typically transferred to a floating diffusion region connected to the gate of the source follower output transistor. A charge transfer device (e.g., transistor) can be included for transferring charge from the photo-conversion device to the floating diffusion region. In addition, such imager cells typically have a transistor for resetting the floating diffusion region to a predetermined charge level prior to charge transfer. The output of the source follower transistor is a voltage output on a column line when a row select transistor for the row containing the pixel is activated.

Exemplary CMOS imaging circuits, processing steps thereof, and detailed descriptions of the functions of various CMOS elements of an imaging circuit are described, for example, in U.S. Pat. No. 6,140,630 to Rhodes, U.S. Pat. No. 6,376,868 to Rhodes, U.S. Pat. No. 6,310,366 to Rhodes et al., U.S. Pat. No. 6,326,652 to Rhodes, U.S. Pat. No. 6,204,524 to Rhodes, and U.S. Pat. No. 6,333,205 to Rhodes. The disclosures of each of the foregoing are hereby incorporated by reference herein in their entirety.

One typical CMOS imager pixel circuit, the three-transistor (3T) pixel, contains a photo-conversion device for supplying photo-generated charge to a diffusion region; a reset transistor for resetting the diffusion region; a source follower transistor having a gate connected to the diffusion region, for producing an output-signal; and a row select transistor for selectively connecting the source follower transistor to a column line of a pixel array. Three-transistor pixel cells have been used to support automatic light control (ALC) operations. ALC is used to control the amount of light integrated by a pixel cell. In a 3T pixel cell, the charge accumulated by a photo-conversion device may be read out prior to resetting the photo-conversion device to a predetermined voltage. Therefore, ALC operations may determine a time for readout based on the amount of charge generated by the photo-conversion device and may adjust the amount of charge further generated by the photo-conversion device in response to the charge present on the photo-conversion device at a particular time.

Another typical CMOS imager pixel employs a four-transistor (4T) configuration, which is similar to the 3T configuration, but utilizes a transfer transistor to gate charge carrier flow from the photo-conversion device to a sensing node, typically a floating diffusion region. In a 4T configuration, the source follower transistor gate is connected to the floating diffusion region. In contrast to the 3T configuration, the 4T configuration facilitates correlated double sampling (CDS), a technique that reduces noise.

Figure 1:
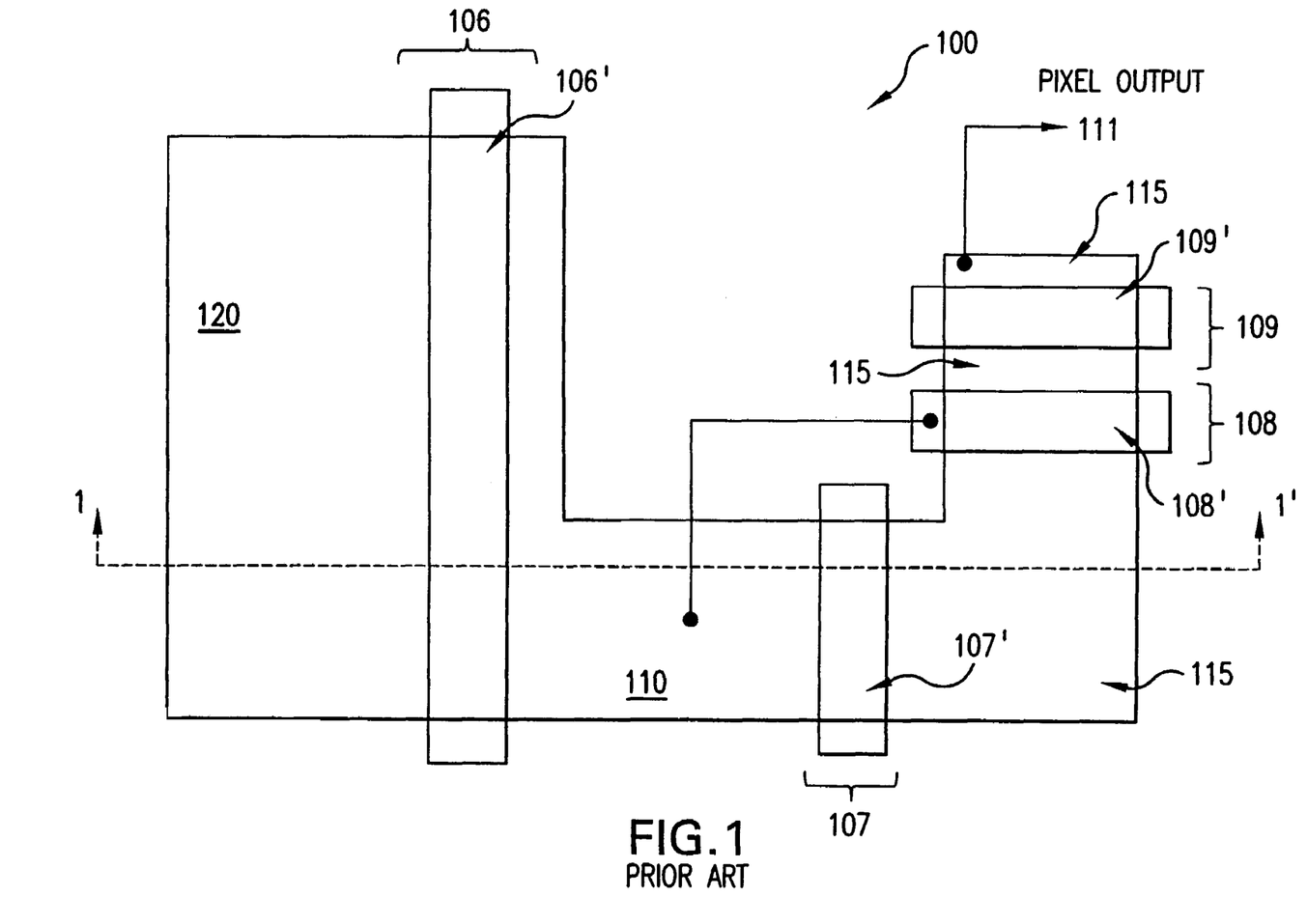
FIG. 1 is a top plan view of a known 4T pixel cell.
Figure 2:
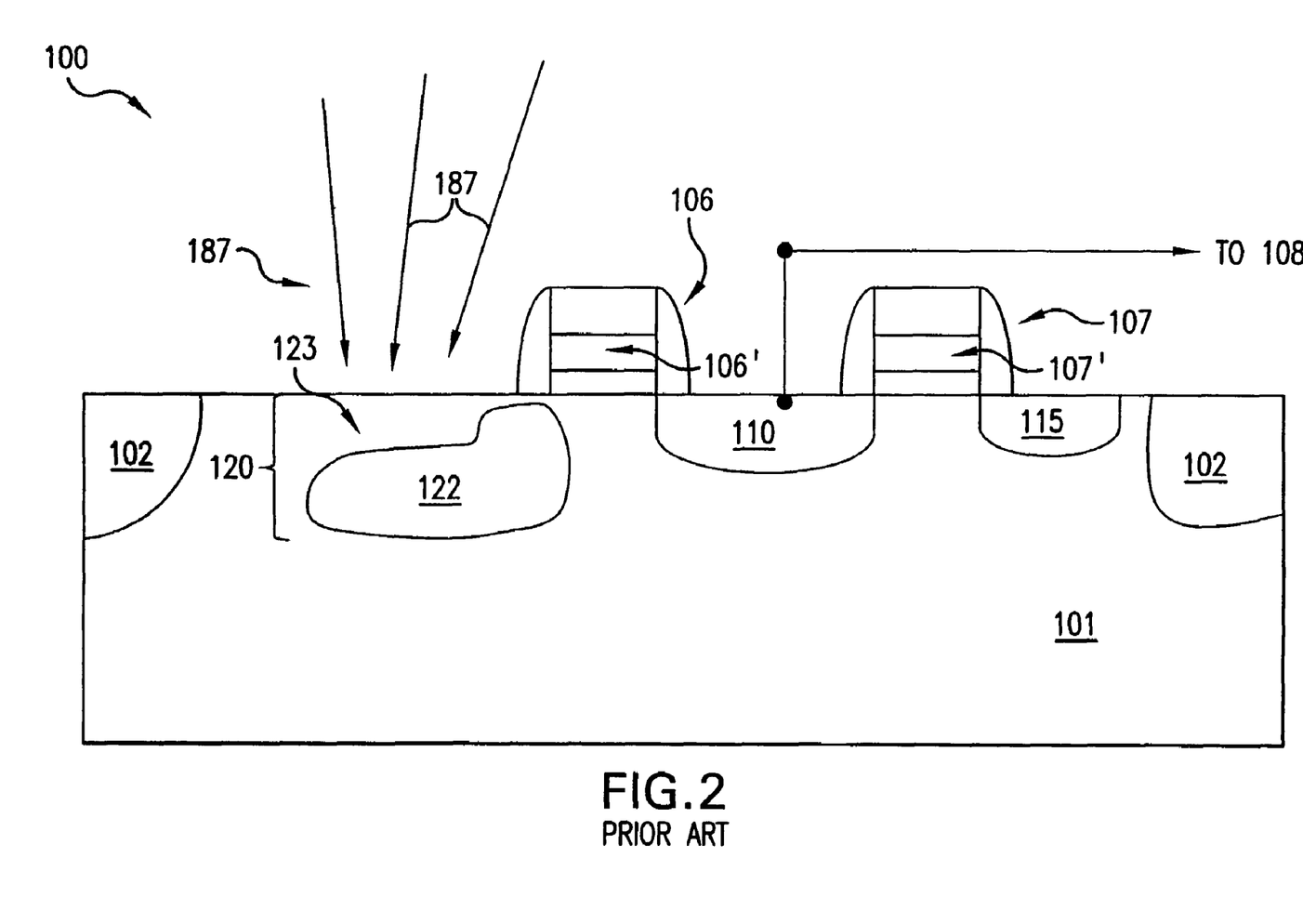
FIG. 2 is a cross-sectional view of the pixel cell of FIG. 1 taken along line 1-1'.

A top view of a portion of a semiconductor wafer fragment containing a CMOS 4T pixel cell 100 is shown in FIG. 1. A cross-sectional view of a portion of the pixel is illustrated in FIG. 2. CMOS pixel cell 100 generally comprises a photo-conversion device 120, in the form of a p-n-p photodiode, for generating free charge carriers in response to external light 187 incident on the pixel, and a transfer gate 106' of transistor 106 for transferring photo-generated charge carriers from the region 122 of photo-conversion device 120 to a sensing node, typically a floating diffusion region 110. The floating diffusion region 110 is electrically connected to the gate 108' of an output source follower transistor 108. The pixel cell 100 also includes a reset transistor 107 having a gate 107' for resetting the floating diffusion region 110 to a predetermined voltage before sensing a signal; and a row select transistor 109 having a gate 109' for outputting a signal from the source follower transistor 108 to an output terminal 111 in response to a row select signal. There are also source/drain regions 115 for the reset, source follower, and row select transistors.

As noted, FIG. 2 is a cross-sectional view of the pixel cell 100 of FIG. 1 taken along line 1-1'. The CMOS pixel cell 100 has a pinned p-n-p photodiode 120 as the photosensor device. Pinned photodiode 120 is adjacent to the gate 106' of a transfer transistor 106 and has a p-type surface layer 123 and an n-type photodiode collection region 122 within a p-type substrate 101.

In the CMOS pixel cell 100 depicted in FIGS. 1 and 2, free electrons are generated by incident light, represented by arrows 187, and accumulate in the n-type photodiode collection region 122. This photo-generated charge is transferred to the floating diffusion region 110 when gate 106' receives a signal that turns on the transfer transistor 106. The source follower transistor 108 produces an output signal from the transferred charge in response to the voltage level received by gate 108'.

Pixel cell 100 is capable of supporting correlated double sampling (CDS) to reduce noise and obtain a more accurate pixel signal. For CDS, the floating diffusion region 110 begins at a predetermined reset voltage level by turning on reset gate 107'; thereafter, the reset voltage produced by the source follower transistor 108 is read out through the row select transistor 109 as a pixel reset signal $V_{rst}$. Then, integrated photo-generated charge from pinned photodiode 120 is transferred to the floating diffusion region 110 by operation of transfer gate 106' and a pixel image signal $V_{sig}$ is read out via the source follower transistor 108. The two values, $V_{rst}$ and $V_{sig}$, are subtracted thereby reducing noise. Additionally, 4T pixel cell 100 provides lower dark current, which also reduces noise.

Although 4T pixel cells, and other similarly configured pixel cells, make it possible to perform correlated double sampling (CDS), they also may interfere with ALC. In a conventional 4T pixel cell 100, because the transfer gate 106' gates the flow of photo-generated charge from the photo-conversion device 120 to the floating diffusion region 110 and, therefore, to readout circuitry, it is not possible to read out photo-generated charge without altering the charge on the photo-conversion device 120. When a 4T readout path is employed to monitor charge level in an ALC operation, the transfer of charge carriers through the transfer transistor therefore tends to destroy or alter the image signal, thus resulting in a degraded image. Therefore, ALC is not readily used with a conventional 4T pixel cell.

It would be advantageous to have improved techniques for measuring pixel light levels reaching a photo-conversion device and to obtain a non-destructive readout of this measurement during the charge integration time of the photo-conversion device.

BRIEF SUMMARY OF THE INVENTION

In various exemplary embodiments, the invention relates to multi-transistor pixels, which provide both an ALC output signal as well as CDS pixel readout signal components. These embodiments allow monitoring of multiple pixel cells of a pixel array to obtain sample data indicating the amount of light reaching the array, while allowing the pixel cells to provide proper image data.

In one exemplary embodiment, a 4T pixel circuit is provided with an additional multi-transistor circuit capable of a non-destructive readout of a photoconversion signal, based on charge being integrated by the photo-conversion device. This non-destructive readout can be used in ALC operations.

DESCRIPTION OF THE DRAWINGS

The above and other features and advantages of the invention will be more readily understood from the following detailed description which is provided in connection with the accompanying drawings, in which.

DETAILED DESCRIPTION OF THE INVENTION

In the following detailed description, reference is made to the accompanying drawings, which form a part hereof and show by way of illustration specific exemplary embodiments in which the invention may be practiced. These embodiments are described in sufficient detail to enable those skilled in the art to practice the invention, and it is to be understood that other embodiments may be utilized, and that structural, logical, and electrical changes may be made without departing from the spirit and scope of the present invention. The described progression of processing and operating steps exemplifies embodiments of the invention; however, the sequence of steps is not limited to that set forth herein and may be changed as is known in the art, with the exception of steps necessarily occurring in a certain order.

The terms "wafer" and "substrate," as used herein, are to be understood as including silicon, silicon-on-insulator (SOI) or silicon-on-sapphire (SOS) technology, doped and undoped semiconductors, and other semiconductor and insulating structures. Furthermore, when reference is made to a "wafer" or "substrate" in the following description, previous processing steps may have been utilized to form regions, junctions, or material layers in or over the base semiconductor structure or foundation. In addition, a semiconductor wafer or substrate need not be silicon-based, but could be based on silicon-germanium, germanium, gallium arsenide or other semiconductors.

The terms "pixel" and "pixel cell," as used herein, refer to a photo-element unit cell containing a photo-conversion device and associated circuitry for converting photons to an electrical signal. The pixels discussed herein are illustrated and described with reference to modifying four transistor (4T) pixel circuits for the sake of example only. It should be understood that the invention may be used with respect to other pixel arrangements having fewer (e.g., 3T) or more (e.g., 5T, 6T) than four transistors or with pixel arrangements using devices other than transistors to provide output signals. And although the invention is described herein with reference to the architecture and fabrication of one pixel, it should be understood that this is representative of a plurality of pixels in an array of an imager device. In addition, the invention is described below with reference to an exemplary CMOS imager, but the invention has applicability to any solid state imaging device having pixels. The following detailed description is, therefore, not to be taken in a limiting sense.

Figure 3:
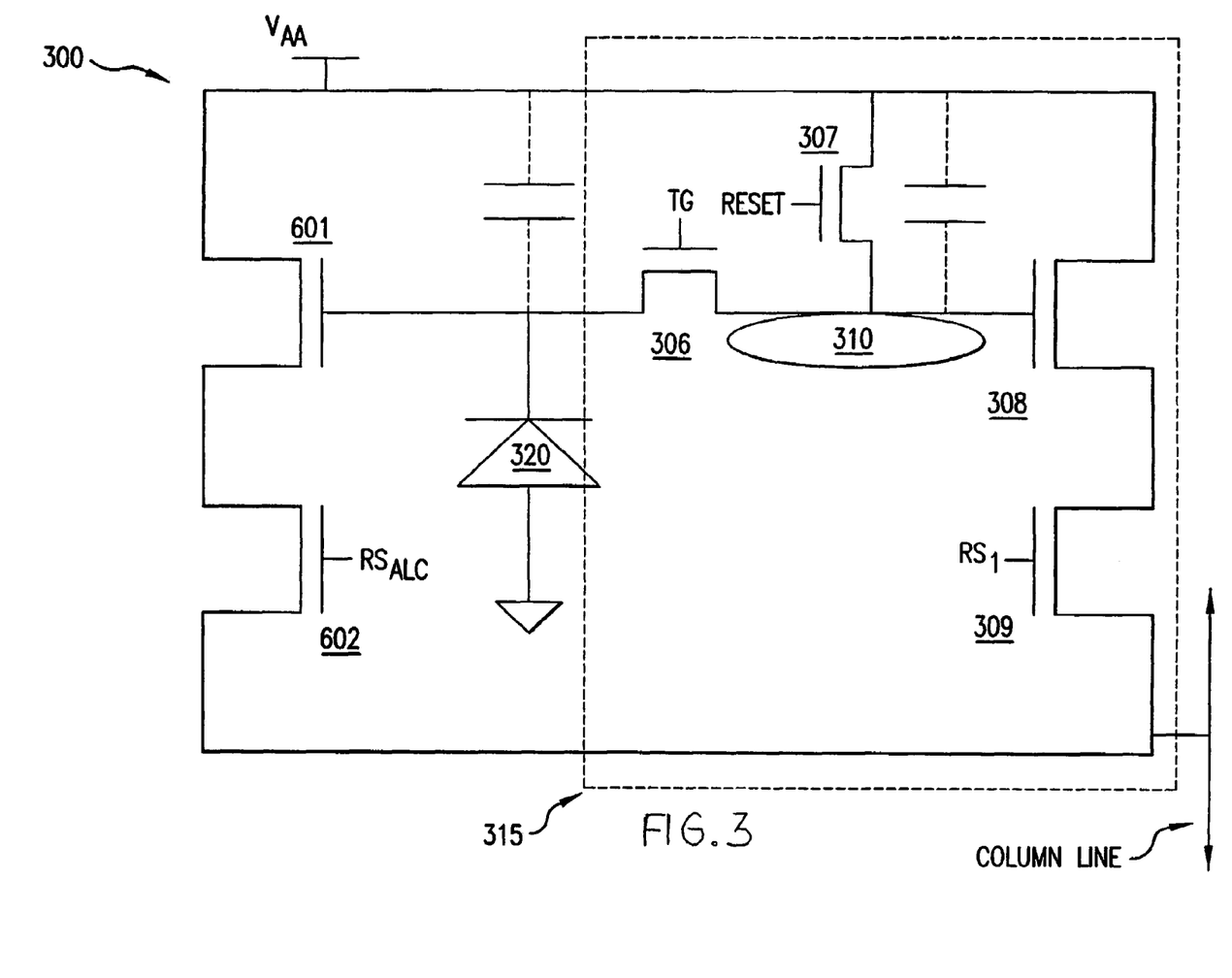
FIG. 3 is a circuit diagram of a pixel cell with two readout paths according to an exemplary embodiment of the invention.

Now referring to the figures, where like reference numbers designate like elements, FIG. 3 is a circuit diagram of an exemplary embodiment of a portion of a pixel cell 300. The multi-transistor pixel cell 300 is fabricated to have a 4T readout circuit 315. The fabrication of all the transistors of this design can be accomplished by any suitable method of forming transistors and is not intended to in any way limit the design.

The 4T readout circuit 315 is capable of correlated double sampling (CDS). In addition, cell 300 includes circuitry that measures integrated charge for automatic light control (ALC) through a parallel readout path, illustrated as a 2T circuit. Circuit 315 is shown in FIG. 3 as a 4T configuration with transfer 306, reset 307, source follower 308, and row select 309 transistors that provide readout signals based on charge transferred to floating diffusion node 310 from photodiode 320.

The exemplary embodiment of the invention depicted in FIG. 3 combines the 4T circuitry 315 with a parallel 2T readout circuit described below. The 2T circuit comprises an additional source follower transistor 601 and an additional row select transistor 602 and can be formed by any suitable method. In other embodiments of the invention, this second readout circuit may employ more transistors than the illustrated 2T design (3T, 4T, etc.). Similarly, other embodiments could provide pixel arrangements using devices other that transistors to provide output signals; another alternative includes a capacitor (not shown) electrically coupled to the floating diffusion node 310 for storing the transferred charges.

In operation of the exemplary pixel 300, which is subsequently described in more detail with reference to FIGS. 4 and 5A-B, when row select transistor 309 is selectively switched on, it allows the circuit 315 to output values $V_{rst}$ and $V_{sig}$ from the pixel cell. When row select transistor 602 of this 2T circuit is turned on, it allows the pixel to output a value $V_{ALC}$.

During an ALC operation, a sampling of pixels in the array occurs intermittently to monitor and control exposure time. As illustrated in FIG. 3, a 2T readout path is employed in parallel with a 4T readout path in order to monitor the amount of light reaching the photo-conversion device 320. In particular, the 2T path is connected directly to a photodiode 320 to minimize destruction of the signal which occurs when only one readout path is utilized. In the FIG. 3 embodiment, the photodiode 320 is utilized as a light sensing node with the 2T readout path connected directly to it. Therefore, the 2T readout path can be used to monitor the photodiode charge without destruction while the 4T path can be used to readout the $V_{rst}$ and $V_{sig}$ voltages from the floating diffusion region 310.

During the 4T path readout of the present invention, correlated double sampling (CDS) of the floating diffusion region is performed, and a reset noise from the diode reset is present. During the 2T path readout, however, no double sampling is performed because the 2T circuit monitors the photodiode charge, and it is undesirable during monitoring to reset the photodiode charge. Thus providing a combined 2T/4T readout, pixel cell 300 may support ALC operations as well as correlated double sampling CDS, as described in more detail herein.

Figure 4:
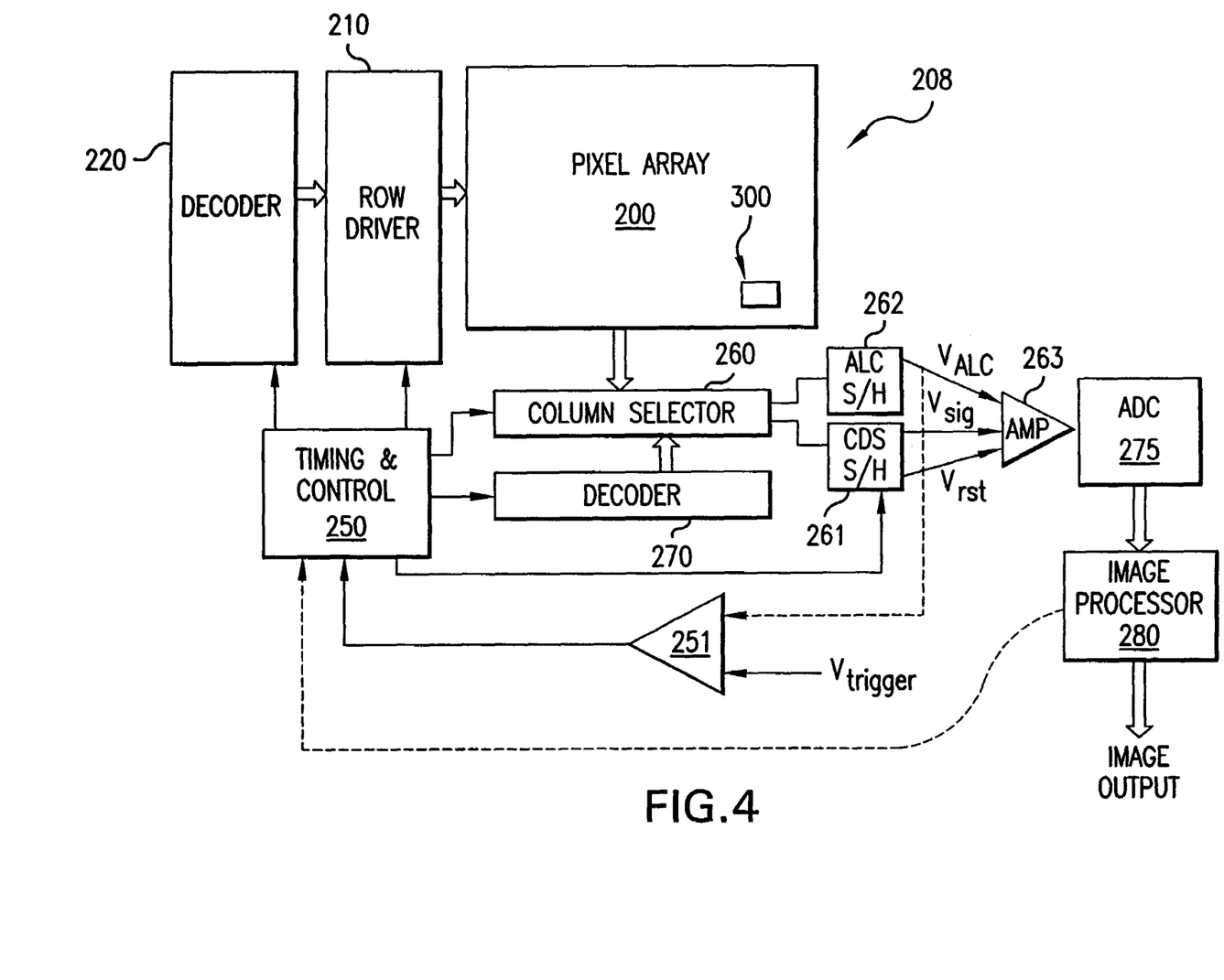
FIG. 4 is a block diagram of an integrated circuit that includes an array with a pixel cell as in FIG. 3.
Figure 6:
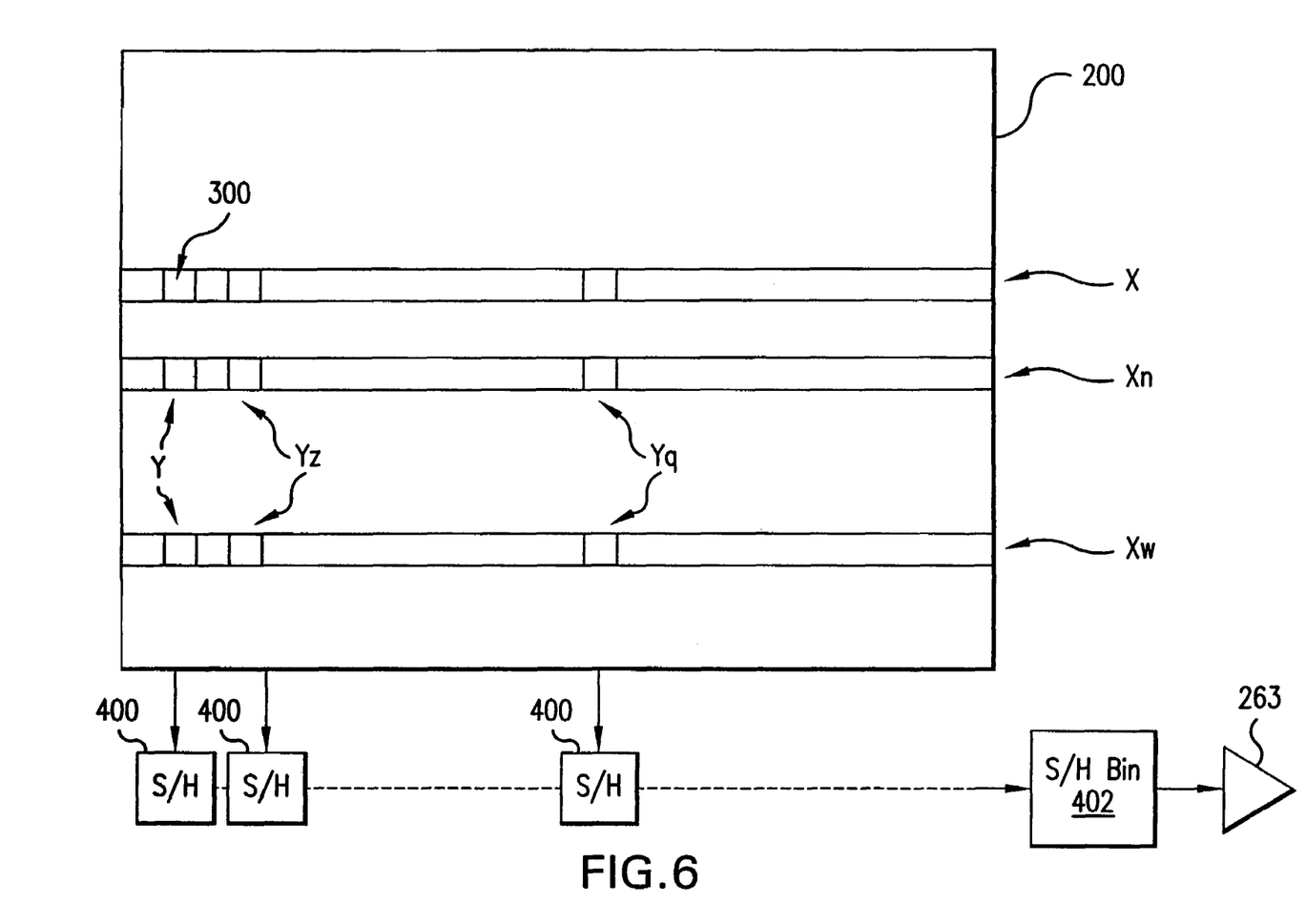
FIG. 6 shows binning of the readouts from a row of pixel sensor cells of a pixel array in the integrated circuit of FIG. 4.

FIG. 4 shows an exemplary CMOS imaging integrated circuit 208 which includes a pixel array 200, with rows and columns of pixel cells. As shown in FIG. 4, the exemplary pixel cell 300 can be one cell of an entire pixel array 200, and each pixel of array 200 could be implemented like cell 300. The pixels of each row in array 200 are turned by either of two row select lines, illustratively $RS_1$ and $RS_{ALC}$. Specifically, row select line $RS_1$ selects the 4T circuit for performing CDS operations, and $RS_{ALC}$ selects certain pixels for ALC readout. All pixels may be turned on at the same time for these operations, however, ALC readout will not occur during $V_{sig}$ readout due to charge transfer to the floating diffusion region. Signals from each column are provided on a respective column line and selectively output by column selector 260 in response to respective column select signals. The row select lines are selectively activated by a row driver 210 in response to a row address decoder 220. The column select lines are selectively activated by a column address decoder 270. Thus, a row and column address (such as row X, column Y as shown in FIG. 6) is provided for each pixel 300 in the array 200.

The pixel array 200 of FIG. 4 is operated by the timing and control circuit 250, which controls address decoders 220, 270 for selecting the appropriate row and column lines for pixel readout and sampling. The control circuit 250 also controls the row and column driver circuitry 210, 260 such that these apply driving voltages to the drive transistors of the selected row and column select lines. Control circuit 250 also controls sample and hold (S/H) circuits 261, 262 to read and store the pixel output signals from column selector 260. For correlated double sampling (CDS) operations, S/H 261 receives pixel reset signal $V_{rst}$ and pixel image signal $V_{sig}$ and provides them to a differential amplifier 263. A differential signal ($V_{sig}$-$V_{rst}$) is produced by differential amplifier 263 for each pixel, and the differential signal is then digitized by the analog to digital converter 275 (ADC). The analog to digital converter 275 supplies the digitized pixel signals to an image processor 280 which forms a digital image.

Additional ALC circuitry includes, in this embodiment, an ALC sample and hold (S/H) circuit 262 for reading the sample voltage, $V_{ALC}$, from a pixel's photo-conversion device. Like $V_{rst}$ and $V_{sig}$, $V_{ALC}$ can be introduced with some suitable reference voltage to the differential amplifier 263, and the differential voltage is then digitized by the analog to digital converter 275. This digitized value can be used by image processor 280 to determine when to signal timing and control circuitry 250 to initiate a readout process. Alternatively in another embodiment (not shown), the $V_{ALC}$ signal can be read by the sample and hold circuit 261 without the need for the additional sample and hold (S/H) circuit 262.

The ALC circuitry may additionally include a peak value monitoring circuit 251 with a separate timing and control device for the ALC operation. A peak value monitoring circuit 251 may be used where a time for readout of the entire pixel array 200 is to be determined based on a monitored pixel cell or set of pixel cells receiving enough light. When used in this manner, $V_{ALC}$ will be sampled either periodically or continuously until it approximates the predetermined reference trigger voltage $V_{trigger}$, at which point the ALC monitoring circuit 251 causes timing and control circuitry 250 to initiate a readout process, including readout of $V_{rst}$ and $V_{sig}$ from all of the pixel cells of array 200.

A value for $V_{trigger}$ may be selected as desired. For example, $V_{trigger}$ may be chosen such that readout will occur only when pixel cells of array 200 have accumulated sufficient charge to result in an image in which characteristics of the imaged subject matter are visible. Otherwise stated, $V_{trigger}$ may be chosen such that a resultant image will not be too dark.

This ALC circuitry just described may be a part of the image sensor integrated circuit 208 or, alternatively, it may be separate from the image sensor integrated circuit 208. Without being limiting, for example, ALC circuitry may be included in the form of hardware or equivalent software in a processor, such as a CPU, which communicates with the image sensor integrated circuit 208.

Figure 5:
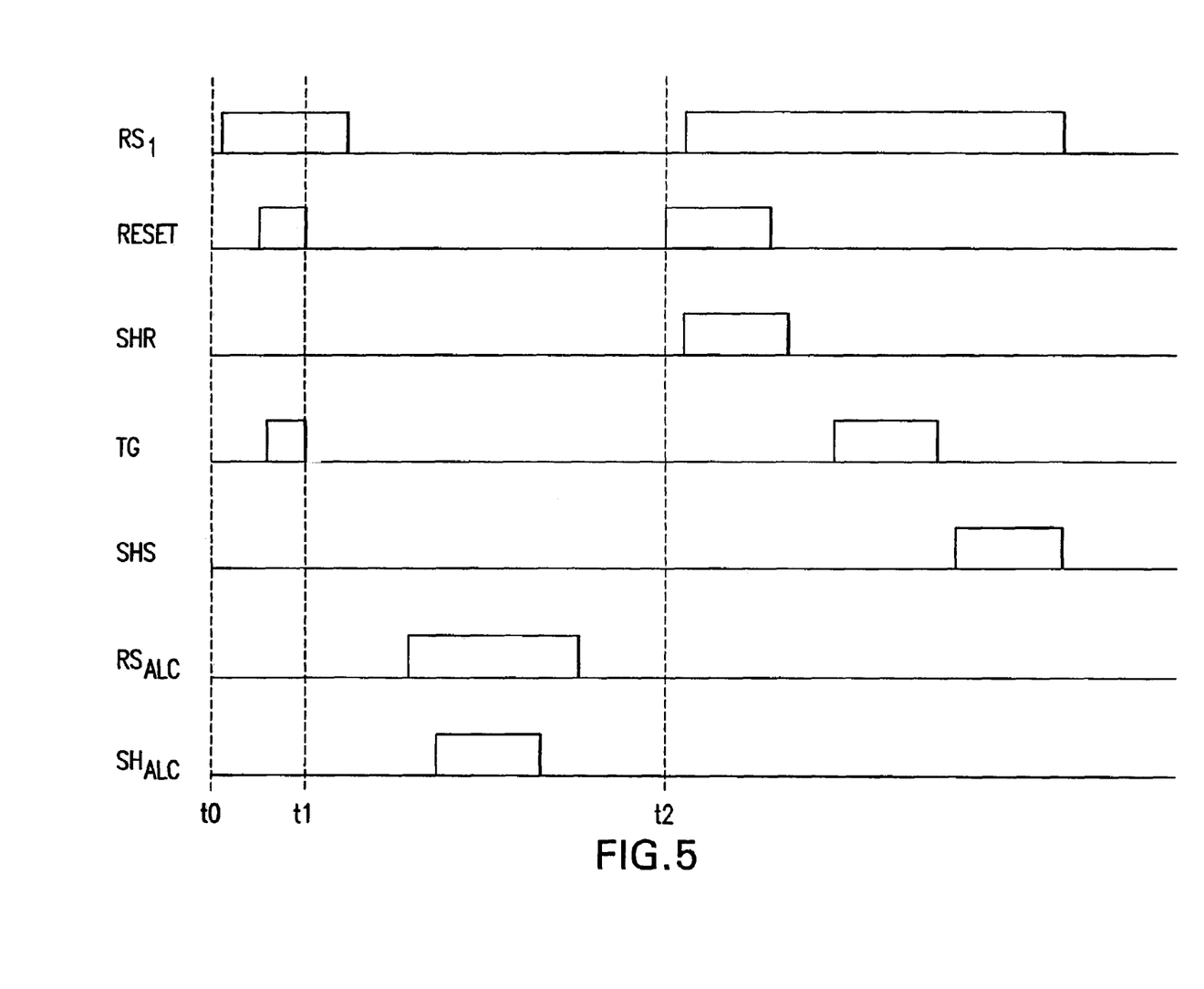
FIG. 5 is an exemplary timing diagram for a monitoring operation of the integrated circuit of FIG. 4.

FIG. 5 is an exemplary timing diagram for the monitoring operations of image sensor integrated circuit 208 as controlled by the timing and control circuit 250. For simplicity, monitoring operations are described with reference to a single pixel cell 300; however, each monitored pixel cell 300 of array 200 may operate as described below in connection with FIG. 5. Also, times t0, t1, and t2 are provided to illustrate the timing of these operations and do not in any way limit the operation of the invention.

FIG. 5 shows a frame readout operation that begins at time t0. The monitoring operation begins by resetting the photosensor 320. For each row of the array 200 concurrently, the timing and control circuitry 250 pulses a row select signal ($RS_1$) high to turn on the row select transistor 309 of each pixel 300 and also pulses a reset signal (reset) high to activate each pixel's reset transistor 307. Timing and control circuitry 250 also pulses a transfer signal (TG) to activate the transfer transistor 306. Any charge on the photosensor 320 is thus transferred through transfer transistor 306 and reset transistor 307. This marks the beginning of the integration period, or charge generating period, for the photosensor 320, illustratively time t1. As an alternative to resetting the photosensor 320 utilizing the reset and transfer transistors, a mechanical shutter (not shown) can be closed and opened to control the light reaching the photodiode. As such, the integration period of the photosensor would begin when the shutter is opened to allow the photosensor 320 to receive light and, in response, to begin generating charges.

During the integration period, illustratively t1-t2, the second readout path of the circuit shown in FIG. 3 provides an output voltage $V_{ALC}$. Timing and control circuitry 250 pulses the row select ($RS_{ALC}$) high activating the transistor 602 and the sample and hold ALC signal $SH_{ALC}$ to high causing the sample and hold circuitry 262 to read out the sample voltage $V_{ALC}$. These sample voltages are read out in sequence for each row of the array 200 that includes pixels for ALC sampling.

Additionally, where peak value monitoring circuitry 251 is used as discussed above, the timing and control circuitry 250 may need to generate several pulses of $RS_{ALC}$ and $SH_{ALC}$ during an integration period, until the readout of $V_{ALC}$ reaches a value of $V_{trigger}$ at time t2. For simplicity, however, FIG. 5 shows only one sample of $V_{ALC}$ taken during the integration period.

Beginning at time t2 of FIG. 5, the CDS signals $V_{rst}$ and $V_{sig}$ are read out from the pixel cell 300. The timing and control circuitry 250 pulses a row select signal (RS$_1$) high to turn on the row select transistor 309 and also pulses a reset signal (Reset) high to activate the reset transistor 307, which now will reset the floating diffusion region 310. At approximately the same time that the reset signal goes high, timing and control circuitry 250 pulses a sample and hold reset signal (SHR) high to cause sample and hold circuitry 261 to read out the resulting output voltage $V_{rst}$. The reset and sample hold reset signals then pass to low. Next, timing and control circuitry 250 pulses a transfer signal (TG) to activate the transfer transistor 306. While TG is high, charge transfers to the floating diffusion region 310 from the accumulated charge that has been generated by the photosensor 320 in response to incident light. Thus, the amount of charge stored in region 310 depends on the amount of external light incident on pixel cell 300. Timing and control circuitry 250 pulses a sample and hold signal (SHS) high to cause sample and hold circuitry 261 to read out the resulting output voltage $V_{sig}$. The steps after time t2 will be repeated in sequence in order to readout signals from all rows of array 200.

Referring now to FIG. 6, some or all of the pixel cells of array 200 may contain the circuitry of pixel cell 300, depicted in FIG. 3, such that several pixel cells can be monitored for light conditions. Pixel cell 300 is shown in FIG. 6 located in Row X and Column Y. For simplicity, only rows X, Xn, and Xw and columns Y, Yz, and Yq are depicted, but array 200 can contain any predetermined number of columns and rows of pixels.

The readout signals of each pixel 300 of array 200 are read out row-by-row as described above with regard to FIG. 4. Referring now to FIG. 6, the signals for any given row, X, will be read out simultaneously. The signals can be additively binned in a S/H bin 400 for each column and then additively binned in S/H bin 402 for the array 200 to produce one signal to the amplifier 263; or alternatively, each signal can be sent and amplified separately and digitally binned after the analog/digital conversion. This binning operation can be done using any suitable techniques, including but not limited to the operations described in Zhou, Z., *Frame-Transfer CMOS Active Pixel Sensor with Pixel Binning*, IEEE Electronic Devices, October 1997, pp. 1764-68, incorporated herein by reference.

Figure 7:
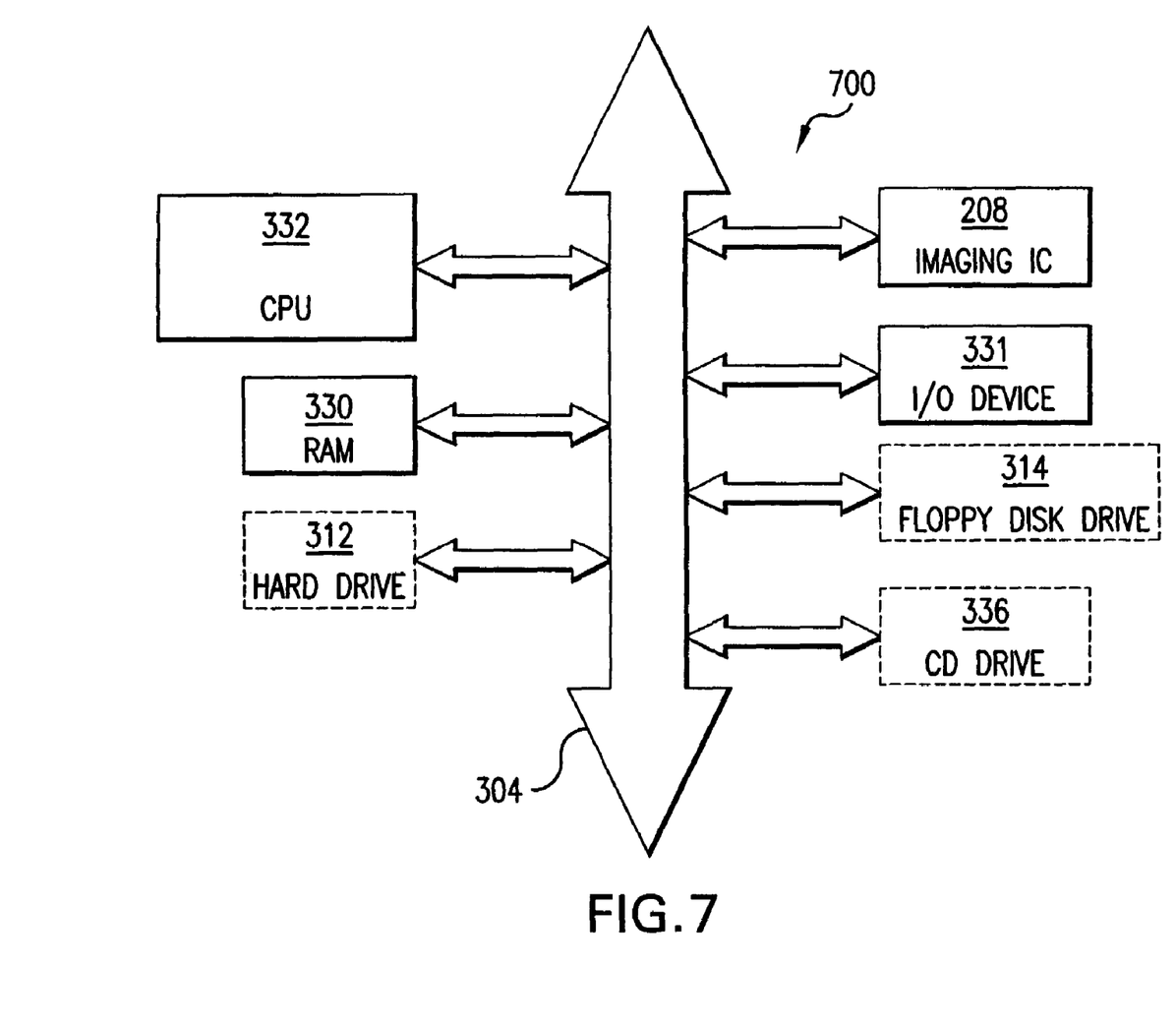
FIG. 7 is a block diagram of a processing system according to an exemplary embodiment of the invention.

A processor system 700 which includes an imager integrated circuit 208, according to FIG. 4, is illustrated generally in FIG. 7. A processor based system 700 is exemplary of a system having digital circuits that could include CMOS imager devices. Without being limiting, such a system could include a computer system, camera system, scanner, machine vision, vehicle navigation, video phone, surveillance system, auto focus system, star tracker system, motion detection system, image stabilization system, and data compression stem.

The imager integrated circuit 208 may receive control or other data from system 700. System 700 includes a processor 332 having a central processing unit (CPU) that communicates with various devices over a bus 304. Some of the devices connected to the bus 304 provide communication into and out of the system 700; an input/output (I/O) device 331 is such a communication device. Other devices connected to the bus 304 provide memory, illustratively including a random access memory (RAM) 330. If used in a computer system, other memory devices include, hard drive 312 and one or more peripheral memory devices such as a floppy disk drive 314 and compact disk (CD) drive 336. The imager circuit 208 may be constructed as shown in FIG. 4 with the pixel array 200 having the characteristics as described above. The imager integrated circuit 208 may, in turn, be coupled to an external processor 332 for image processing, or other image handling operations.

The processes and devices described above illustrate exemplary methods and typical devices of many that could be used and produced. The above description and drawings illustrate embodiments, which achieve the objects, features, and advantages of the present invention. However, it is not intended that the present invention be strictly limited to the above-described and illustrated embodiments. Any modifications, though presently unforeseeable, of the present invention that come within the spirit and scope of the following claims should be considered part of the present invention.

What is claimed as new and desired to be protected by Letters Patent of the United States is:

1. A pixel circuit comprising:
   a photo-conversion device for accumulating photogenerated charge during an integration period;
   first and second readout circuits each connected to the photo-conversion device, wherein said second readout circuit is capable of providing an output signal, during the integration period, based on a non-destructive readout that does not remove the accumulated charge from the photo-conversion device, and said first readout circuit is capable of providing an output signal, after the integration period, indicating an amount of said accumulated charge transferred out of said photo-conversion device.

2. The pixel circuit of claim 1, further comprising an automatic light control circuit for controlling the amount of photogenerated charge accumulated by said photo-conversion device based on said output signal from said second readout circuit.

3. The pixel circuit of claim 2, wherein said second readout circuit is capable of providing an output signal indicating a level of charge in the photo-conversion device, with a non-destructive readout that does not remove the accumulated charge from said photo-conversion device, more than once during the integration period for said photo-conversion device.

4. The pixel circuit of claim 3, wherein said automatic light control circuit is constructed to compare said output signal to a threshold level, and when said output signal from said second readout circuit approximates said threshold level, to cause a signal to be readout from said second readout circuit.

5. The pixel circuit of claim 1, wherein said photo-conversion device is a photodiode.

6. The pixel circuit of claim 1, wherein said first readout circuit is a four-transistor circuit and said second readout circuit comprises fewer than four transistors.

7. The pixel circuit of claim 6, wherein said first readout circuit further comprises:
   a first source follower transistor for receiving accumulated charges at a gate thereof and producing a pixel output signal;
   a storage node for receiving said charges accumulated during said integration period, said gate of said source follower transistor connected to said storage node;
   a reset transistor for resetting said storage node to a predetermined state before receiving charges from the photosensor; and
   a selectively operable readout transistor for selectively reading out said pixel output signal produced by the first source follower transistor.

8. The pixel circuit of claim 7, wherein said first readout circuit further comprises a transfer transistor for transferring accumulated charges from the photo-conversion device to the storage node.

9. The pixel circuit of claim 8, further comprising a storage capacitor coupled to said storage node.

10. The pixel circuit of claim 6, wherein said first and second readout circuits comprise row select transistors that are separably operable for selectively reading out signals received from respective first and second source follower transistors.

11. The pixel circuit of claim 1, wherein said first readout circuit provides a pixel signal and a reset pixel signal and said second readout circuit provides a signal for automatic light control operations.

12. The pixel circuit of claim 1, further comprising:
a first sample and hold memory capacitor for receiving thereat output signals from said first readout circuit; and
a second sample and hold memory capacitor for receiving thereat output signals from said second readout circuit.

13. A method of operating a pixel circuit, said pixel circuit comprising a photosensor, a storage node, and first and second readout circuits each connected to said photosensor, said method comprising:
applying light to said photosensor;
accumulating photogenerated charge by said photosensor, during an integration period, in response to said applied light;
outputting a control signal by said second readout circuit, during said integration period, said control signal representing a non-destructive readout that does not remove the accumulated charge from said photosensor;
transferring said accumulated charge from said photosensor to said storage node; and
generating an output signal, by said first readout circuit, indicating the amount of accumulated charge stored by the photosensor at the end of said integration period.

14. The method of claim 13, further comprising monitoring said signal output of said second readout signal until said signal approximates a predetermined level, and then in response, initiating said outputting of the signal output from the first readout circuit.

15. The method of claim 13, further comprising the act of transferring said charge from said photosensor to said storage node on said pixel circuit.

16. The method of claim 15, further comprising resetting the storage node to a predetermined state before transferring said generated charge from said photosensor to said storage node and producing a signal by said first readout circuit representing said predetermined state.

17. The method of claim 16, further comprising providing said signals representing said predetermined state and said signal representing said stored charge to a differential amplifier.

18. The method of claim 13, wherein the act of receiving and outputting a signal representing said charge generated by said photo sensor up to the time of readout by said second readout circuit during said integration period with a non-destructive readout of charge carriers at said photosensor is performed more than once during said integration period.

19. The method of claim 13, wherein said first readout circuit provides a pixel signal and a reset pixel signal and said second readout circuit provides a signal for automatic light control operations.

* * * * *